United States Patent
Okajima

(10) Patent No.: US 7,851,305 B2
(45) Date of Patent: Dec. 14, 2010

(54) METHOD OF MANUFACTURING NONVOLATILE SEMICONDUCTOR MEMORY

(75) Inventor: Mutsumi Okajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 296 days.

(21) Appl. No.: 11/945,782

(22) Filed: Nov. 27, 2007

(65) Prior Publication Data

US 2009/0011558 A1    Jan. 8, 2009

(30) Foreign Application Priority Data

Nov. 30, 2006  (JP) .............................. 2006-324177

(51) Int. Cl.
 *H01L 29/788*  (2006.01)
(52) U.S. Cl. ................ 438/257; 257/316; 257/E21.422
(58) Field of Classification Search ................. 257/316, 257/E21.422; 438/257
See application file for complete search history.

(56) References Cited

U.S. PATENT DOCUMENTS

| 5,627,095 A * | 5/1997 | Koh et al. ................... 438/672 |
| 6,060,346 A * | 5/2000 | Roh et al. ................... 438/200 |
| 2004/0178470 A1 * | 9/2004 | Hieda .......................... 257/510 |
| 2005/0082602 A1 | 4/2005 | Okajima |
| 2006/0038218 A1 * | 2/2006 | Yaegashi et al. ............. 257/314 |
| 2007/0064496 A1 * | 3/2007 | Oh .......................... 365/185.29 |
| 2007/0120166 A1 * | 5/2007 | Arai et al. .................... 257/296 |

FOREIGN PATENT DOCUMENTS

| JP | 2002-231835 | 8/2002 |
| JP | 2005-123524 | 5/2005 |

* cited by examiner

*Primary Examiner*—Thao X Le
*Assistant Examiner*—Tanika Warrior
(74) *Attorney, Agent, or Firm*—Finnegan, Henderson, Farabow, Garrett & Dunner, L.L.P.

(57) ABSTRACT

A method of manufacturing a NAND nonvolatile semiconductor memory which involves forming a bit line contact between adjacent select transistors of the NAND nonvolatile semiconductor memory, the method has patterning memory cells and said select transistors of said NAND nonvolatile semiconductor memory; forming a first insulating film between adjacent two of said memory cells, between said memory cells and said select transistors, and between adjacent two of said select transistors; selectively etching the first insulating film between said select transistors to form a side wall spacer on each of said select transistors; forming a second insulating film on said memory cells, said first insulating film between said memory cells, said select transistors and said side wall spacers; forming a resist pattern on said second insulating film; and simultaneously forming an opening in an insulating film and a control gate on a floating gate of each of said select transistors using said resist pattern and an opening between said adjacent select transistors using said resist pattern.

11 Claims, 5 Drawing Sheets

METHOD OF MANUFACTURING NONVOLATILE SEMICONDUCTOR MEMORY

CROSS-REFERENCE TO RELATED APPLICATION

This application is based upon and claims the benefit of priority from the prior Japanese Patent Application No. 2006-324177, filed on Nov. 30, 2006, the entire contents of which are incorporated herein by reference.

BACKGROUND OF THE INVENTION

1. Field of the Invention

The present invention relates to a method of manufacturing a nonvolatile semiconductor memory, such as a NAND nonvolatile semiconductor memory.

2. Background Art

In the memory cell part of a conventional nonvolatile semiconductor memory, device regions and device isolation regions are formed in a line and space pattern having a pitch of 2F, supposing that the design rule is F. A plurality of memory cell transistors are formed in a line and space pattern having the same pitch of 2F perpendicularly to the line and space pattern of the device regions and device isolation regions.

Select transistors are formed on the opposite sides of the memory cell transistors. Contacts connected to the device regions are formed between adjacent select transistors. The contacts include contacts that serve as a bit line contact and contacts that are connected to each other by wiring on the top thereof and serve as a source line.

In regions of the select transistors and a peripheral transistor, an opening is formed in an insulating film (inter-poly dielectric (IPD) film), through which the floating gate and the control gate are electrically connected to each other.

To establish this connection, a method of forming the opening before forming the control gate or a method of forming the opening after forming the control gate can be used (see Japanese Patent Laid-Open Publication No. 2005-123524, for example).

According to the conventional method described above, for example, when the distance between adjacent contacts decreases as the NAND nonvolatile semiconductor memory becomes smaller, the possibility of a short circuit between the bit line contacts increases. If the contact diameter is reduced to prevent the short circuit, the margin for lithography for forming the contact pattern is reduced. In addition, there is a problem that the contact resistance increases because the contact area between the contact and the device region decreases.

To solve the problem, there has been proposed a method of adequate distance between adjacent contacts by arranging the contacts in a zigzag pattern.

However, this method requires a margin for preventing a short circuit between the select transistors and the contacts. Therefore, the distance between the select transistors has to be increased, and as a result, the chip size increases.

Alternatively, there has been proposed a method of forming a source line separately from a bit line contact (see Japanese Patent Laid-Open Publication No. 2002-231835 and, for example). Prior to formation of a bit line contact, a pattern is formed in an additional lithography step, an interlayer insulating film is etched to form a groove extending to a device region, and a conductive material is embedded in the groove. In this way, a source line is formed in advance. Then, an additional interlayer insulating film is stacked thereon to form a bit line contact.

In this case, the distance between the select transistors on the side of the source line can be smaller than the distance between the select transistors on the side of the bit line, and therefore, the increase of the chip size can be prevented.

However, the conventional method has a problem that the manufacturing cost increases because the method requires an additional step of forming the source line.

SUMMARY OF THE INVENTION

According to one aspect of the present invention, there is provided: a method of manufacturing a NAND nonvolatile semiconductor memory which involves forming a bit line contact between adjacent select transistors of the NAND nonvolatile semiconductor memory, the method comprising:

patterning memory cells and said select transistors of said NAND nonvolatile semiconductor memory;

forming a first insulating film between adjacent two of said memory cells, between said memory cells and said select transistors, and between adjacent two of said select transistors;

selectively etching the first insulating film between said select transistors to form a side wall spacer on each of said select transistors;

forming a second insulating film on said memory cells, said first insulating film between said memory cells, said select transistors and said side wall spacers;

forming a resist pattern on said second insulating film; and simultaneously forming an opening in an insulating film and a control gate on a floating gate of each of said select transistors using said resist pattern and an opening between said adjacent select transistors using said resist pattern.

According to the other aspect of the present invention, there is provided: a method of manufacturing a NAND nonvolatile semiconductor memory which involves forming a bit line contact between adjacent select transistors of the NAND nonvolatile semiconductor memory, the method comprising:

patterning memory cells and said select transistors of said NAND nonvolatile semiconductor memory;

forming a first insulating film between adjacent two of said memory cells, between said memory cells and said select transistors, and between adjacent two of said select transistors;

selectively etching the first insulating film between said select transistors to form a side wall spacer on each of said select transistors;

forming a second insulating film on said memory cells, said first insulating film between said memory cells, said select transistors and said side wall spacers;

forming a first resist pattern on said second insulating film;

forming an opening in an insulating film and a control gate on a floating gate of each of said select transistors using said first resist pattern;

forming a second resist pattern on said second insulating film;

forming an opening between said adjacent select transistors using said second resist pattern; and simultaneously embedding a conductive film in said openings to form a connection layer that connects the floating gate and the control gate of each of said select transistors to each other and said bit line contact between said adjacent select transistors.

DETAILED DESCRIPTION

Embodiments of the present invention will be described below with reference to the drawings. In the following description, the present invention is applied to a NAND nonvolatile semiconductor memory. However, the present invention can equally be applied to a NOR nonvolatile semiconductor memory.

First Embodiment

Figure 1:
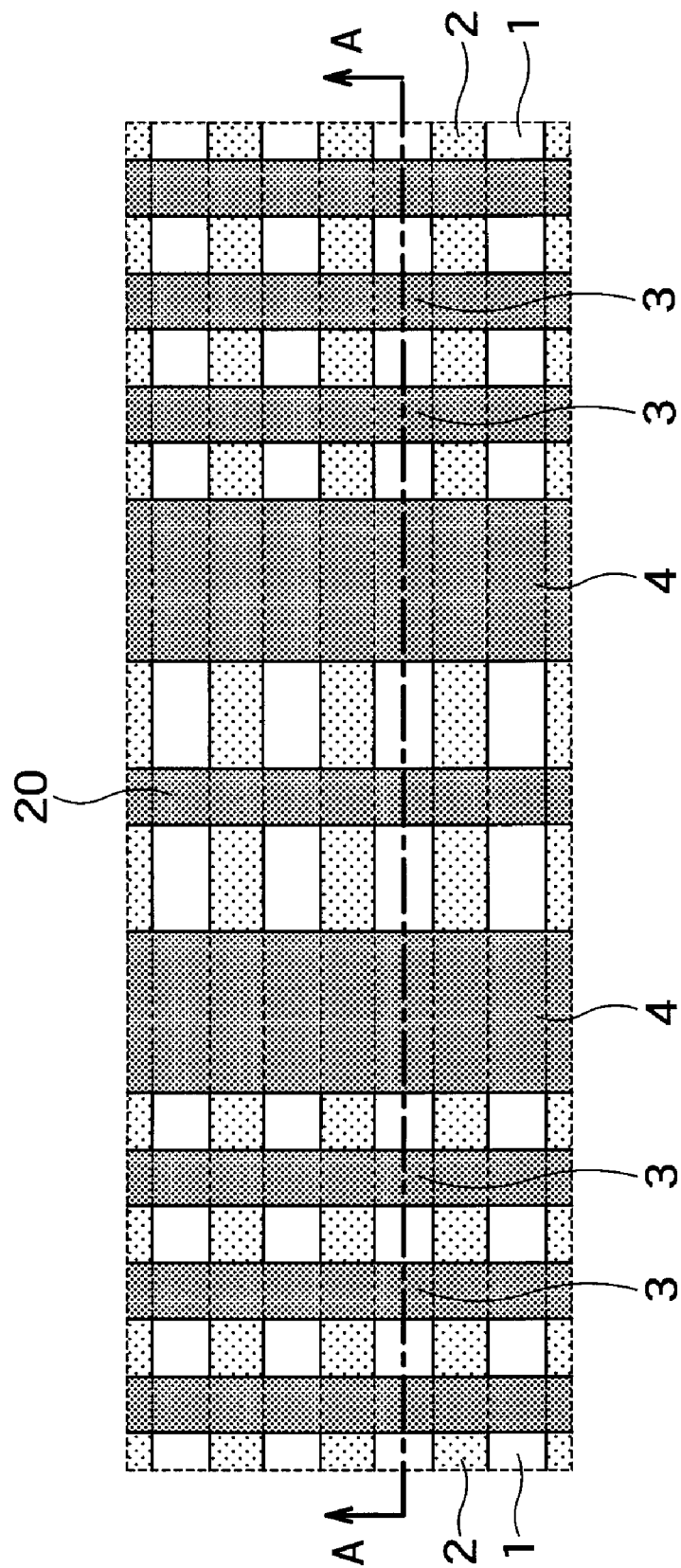
FIG. 1 is a top view of a NAND nonvolatile semiconductor memory, viewed from a top surface of a substrate, showing a configuration of a memory area.

FIG. 1 is a top view of a NAND nonvolatile semiconductor memory, viewed from a top surface of a substrate, showing a configuration of a memory area.

As shown in FIG. 1, in a memory area of a NAND nonvolatile semiconductor memory 100, a device region 1 and a device isolation region 2 are formed in a line and space pattern. In the device region 1, a plurality of memory cells 3 are connected in series to form a memory cell unit.

The NAND nonvolatile semiconductor memory 100 typically has two select transistors 4 for every 16 or 32 gate lines of the transistors of the memory cells 3. A source line 20 is formed between the adjacent select transistors 4.

In the following, with reference to cross-sectional views taken along the line A-A in FIG. 1, a method of manufacturing a nonvolatile semiconductor memory according to a first embodiment will be described. FIGS. 2 to 10 are the cross-sectional views taken along the line A-A in FIG. 1, which show the steps of the method of manufacturing a nonvolatile semiconductor memory according to the first embodiment, which is an aspect of the present invention.

First, a first gate insulating film (tunnel oxide film) 6 is formed on a semiconductor substrate 5 of silicon or the like, a first conductive film (phosphorus doped polysilicon film, for example) 7 is formed on the first gate insulating film 6, and then, a device isolation region (not shown) is formed.

Figure 2:
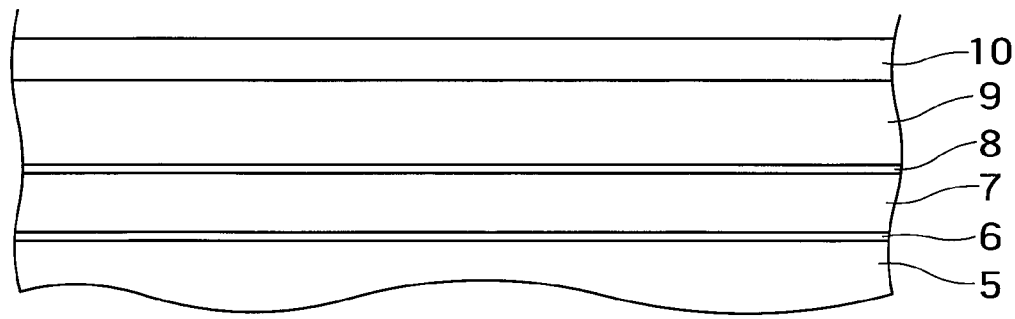
FIG. 2 is a cross-sectional view taken along a line A-A in FIG. 1, which shows a step of a method of manufacturing a nonvolatile semiconductor memory according to a first embodiment.

Then, on the first conductive film 7 and the device isolation region, a second conductive film (phosphorus doped polysilicon film, for example) 9 is formed with a second gate insulating film 8 interposed therebetween. The second gate insulating film 8 is an ONO film composed of a stack of a silicon oxide film, a silicon nitride film and a silicon oxide film formed by low pressure chemical vapor deposition (LP-CVD), for example. Furthermore, a silicon nitride film 10 is formed on the second conductive film 9 (FIG. 2).

Figure 3:
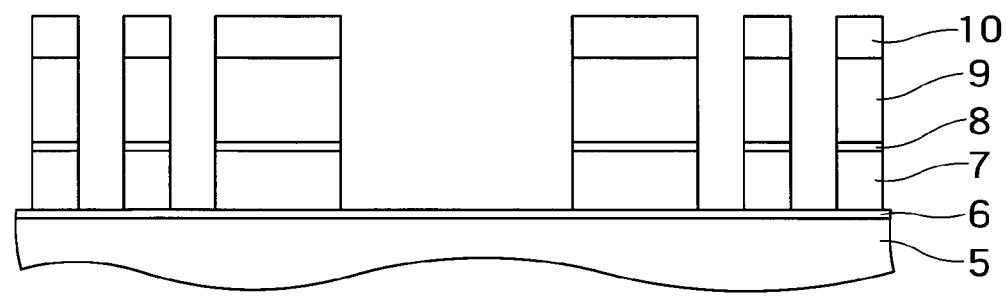
FIG. 3 is a cross-sectional view taken along the line A-A in FIG. 1, which shows a step of the method of manufacturing a nonvolatile semiconductor memory according to the first embodiment.

Then, a resist pattern (not shown) used for patterning of floating gates and control gates of the memory cells 3 and select gates of the select transistors 4 disposed at the opposite ends of the memory cells 3 is formed by lithography. Then, the silicon nitride film 10, the second conductive film 9, the second gate insulating film 8 and the first conductive film 7 are successively etched by dry etching, for example. Then, the resist pattern is subjected to ashing and then removed with a chemical solution (FIG. 3).

In this way, the first conductive film 7, the second gate insulating film 8 and the second conductive film 9 are selectively removed, and the floating gates and the control gates of the memory cells 3, and the select gates of the select transistors 4 are formed.

Figure 4:
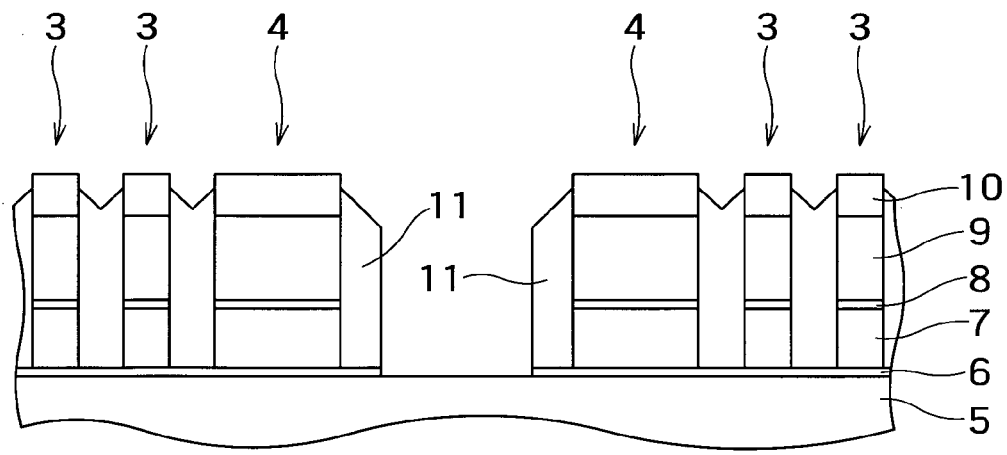
FIG. 4 is a cross-sectional view taken along the line A-A in FIG. 1, which shows a step of the method of manufacturing a nonvolatile semiconductor memory according to the first embodiment.

Then, thermal oxidation is performed for recovery from damage by the dry etching, and then, a silicon oxide film, which serves as an insulating film, is formed by LP-CVD. Then, the silicon oxide film is selectively etched by dry etching, and an interlayer insulating film (side wall spacer) 11 is formed on the side walls of the gate lines. In this step, the gaps between the memory cells 3 and between the memory cells 3 and the select transistors 4 are filled with the interlayer insulating film 11 (FIG. 4). A side wall spacer 11 is formed also on the side walls of the select transistors 4.

Figure 5:
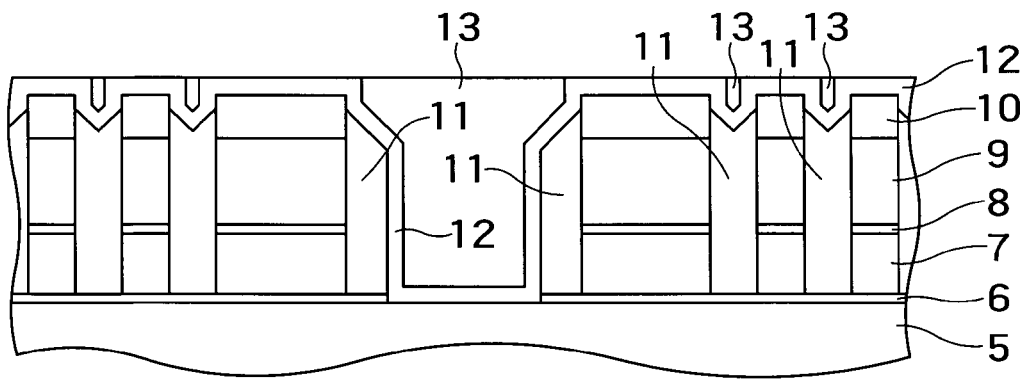
FIG. 5 is a cross-sectional view taken along the line A-A in FIG. 1, which shows a step of the method of manufacturing a nonvolatile semiconductor memory according to the first embodiment.

Then, a silicon nitride film 12, which serves as an insulating film, is formed by LP-CVD on the entire surface. Specifically, the silicon nitride film 12 serving as an insulating film is formed on the memory cells 3, the interlayer insulating films 11 between the memory cells 3, the select transistors 4, and the side wall spacer 11. Furthermore, a silicon oxide film 13, which serves as an insulating film, is formed by LP-CVD on the silicon nitride film 12. Then, planarization by chemical mechanical polishing (CMP) is performed using the silicon nitride film 12 as a stopper (FIG. 5). The silicon nitride film 12 can be omitted.

Figure 6:
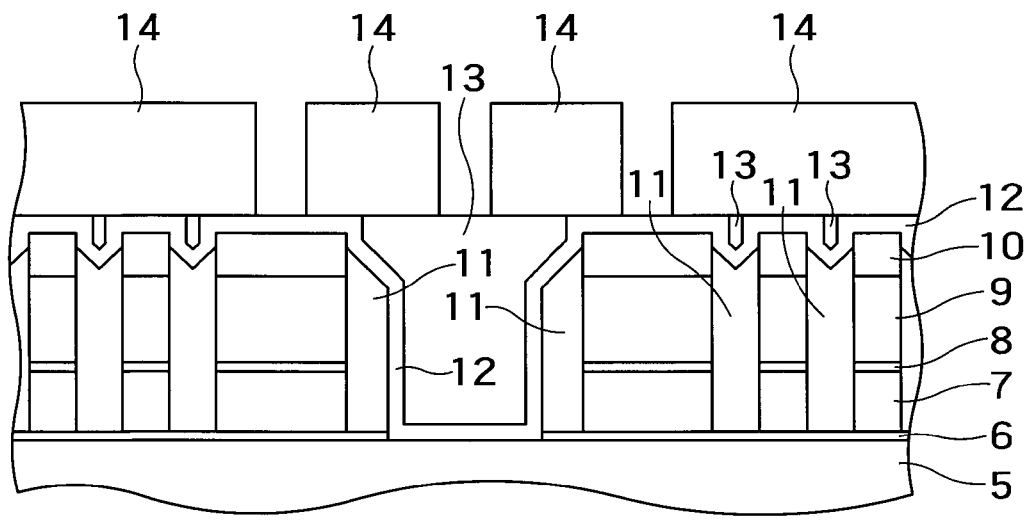
FIG. 6 is a cross-sectional view taken along the line A-A in FIG. 1, which shows a step of the method of manufacturing a nonvolatile semiconductor memory according to the first embodiment.

Then, a resist pattern 14 used for simultaneously forming a first contact hole and a second contact hole is formed by lithography (FIG. 6).

Then, in a region in which the select transistor 4 is to be formed, the silicon nitride films 10 and 12, the second conductive film (phosphorus doped polysilicon film) 9 and the second gate insulating film (ONO film) 8 are etched by dry etching.

In this way, a first contact hole 15, which is an opening, is formed in the insulating film (second gate insulating film 8) and the control gate (second conductive film 9) on the floating gate (first conductive film 7) of the select transistor 4. The first contact hole 15 is intended to allow formation of a connection layer that electrically connects the second conductive film 9 in the region in which the select transistor 4 is to be formed to the first conductive film 7 in the region in which the select transistor 4 is to be formed.

On the source side in the region in which the select transistor 4 is to be formed, the silicon oxide film 13 and the silicon nitride film 12 are simultaneously etched by dry etching. In this way, a second contact hole 16, which is an opening, is formed between the select transistors 4, thereby exposing the surface of the semiconductor substrate 5. The second contact hole 16 is intended to allow formation of a wiring layer that is electrically connected to the semiconductor substrate in the interlayer insulating film 13 between the adjacent select transistors.

Figure 7:
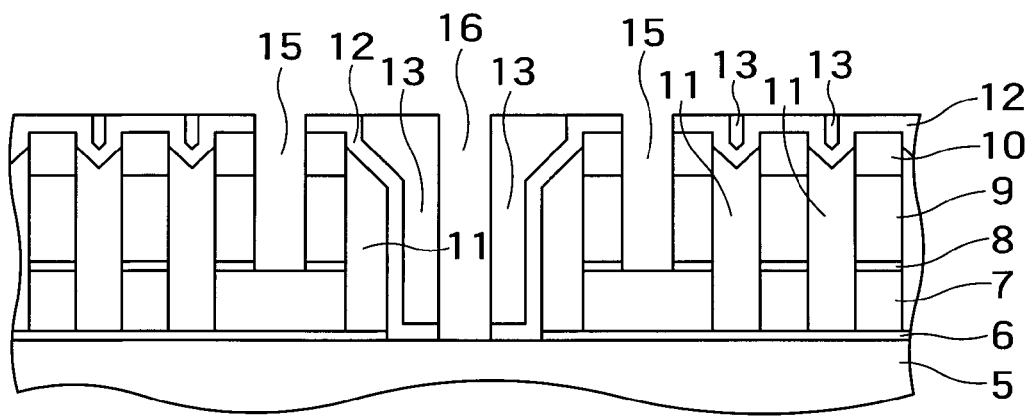
FIG. 7 is a cross-sectional view taken along the line A-A in FIG. 1, which shows a step of the method of manufacturing a nonvolatile semiconductor memory according to the first embodiment.

Following the dry etching, the resist pattern 14 is subjected to ashing and then removed with a chemical solution (FIG. 7).

In this way, the first contact hole 15 and the second contact hole 16 are simultaneously formed using the resist pattern 14 as a mask. In other words, the opening in the insulating film and control gate on the floating gate of each select transistor 4 and the opening between the select transistors are simultaneously formed using the same resist pattern.

Figure 8:
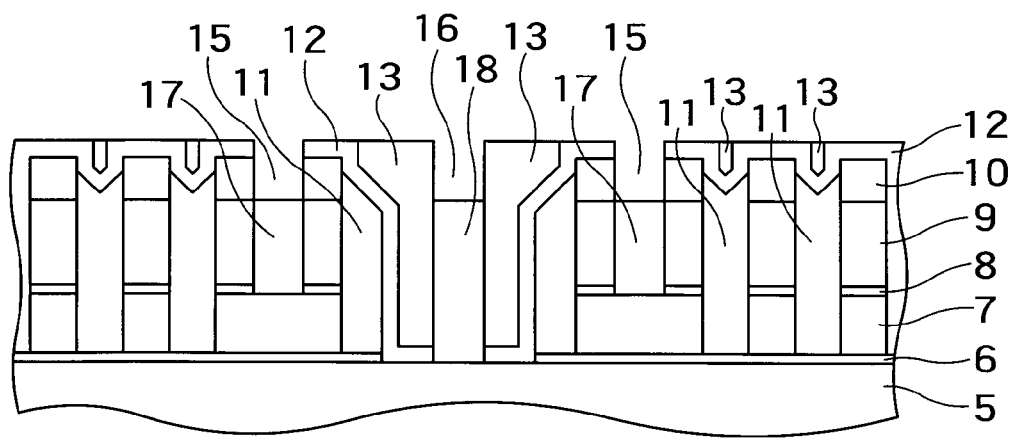
FIG. 8 is a cross-sectional view taken along the line A-A in FIG. 1, which shows a step of the method of manufacturing a nonvolatile semiconductor memory according to the first embodiment.

Then, a third conductive film (phosphorus doped polysilicon film, for example) is formed by LP-CVD in the first contact hole 15 and the second contact hole 16 and then etched back by dry etching. In this way, the third conductive film is embedded simultaneously in the first contact hole 15 and the second contact hole 16, thereby forming a connection layer 17 and a wiring layer (bit line contact) 18 (FIG. 8).

In this embodiment, the wiring layer 18 constitutes the source line electrically connected to the select transistors 4.

The connection layer 17 can be used not only for the select transistors 4 but also for another transistor (not shown) near the select transistors 4.

The wiring layer 18 can also be used as a line other than the source line. In this case, the second contact hole 16 in which the wiring layer 18 is formed may not penetrate to the semiconductor substrate 5. In other words, the wiring layer may be embedded in the interlayer insulating film.

Figure 9:
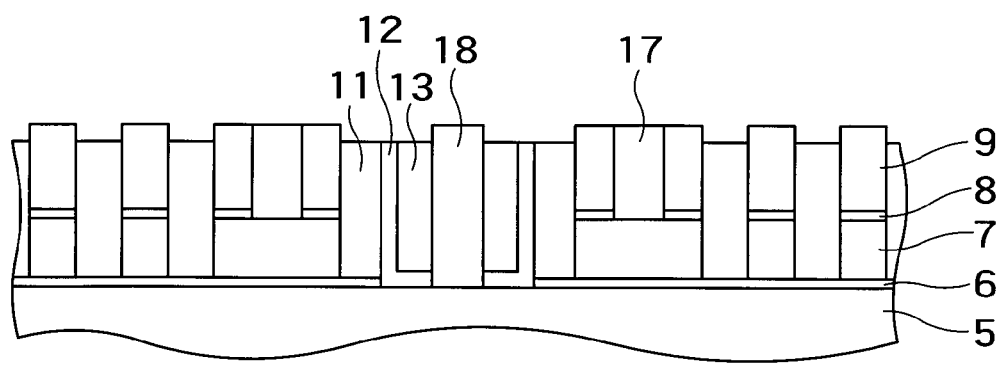
FIG. 9 is a cross-sectional view taken along the line A-A in FIG. 1, which shows a step of the method of manufacturing a nonvolatile semiconductor memory according to the first embodiment.

Then, the silicon nitride films 10 and 12 and the silicon oxide films 11 and 13 are etched by dry etching, for example, to expose the upper surface of the second conductive film 9, which serves as the control gates of the memory cells (FIG. 9).

Figure 10:
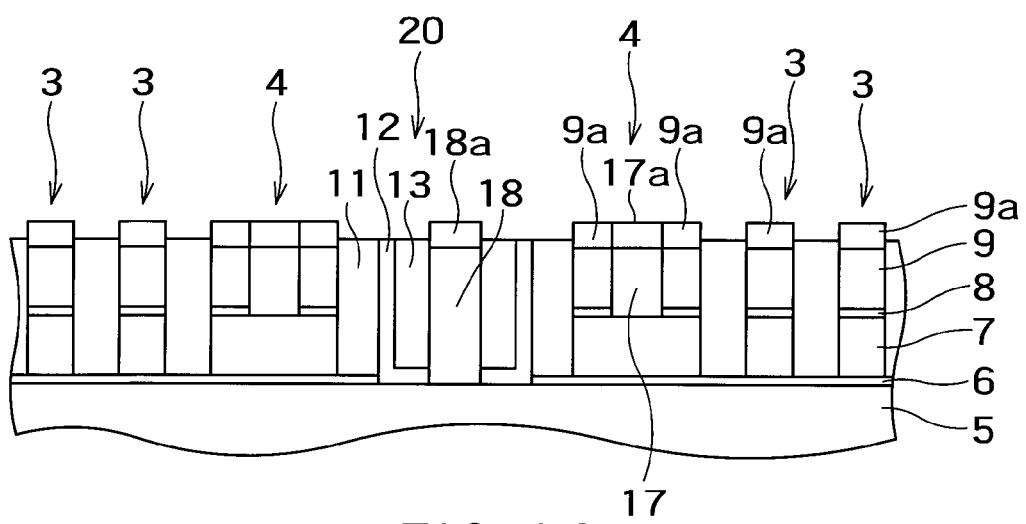
FIG. 10 is a cross-sectional view taken along the line A-A in FIG. 1, which shows a step of the method of manufacturing a nonvolatile semiconductor memory according to the first embodiment.

Then, the surface of the second conductive film 9, the surface of the connection layer 17 and the surface of the wiring layer 18 are silicided by the self-aligned silicide (salicide) process to form silicide films 9a, 17a and 18a. In this embodiment, for example, cobalt silicide is formed at the surface of the exposed phosphorus doped polysilicon film (FIG. 10). In other words, the surface of the control gate of the memory cell 3, the surface of the control gate of the select transistor 4 and the surface of the bit line contact are silicided.

In this way, the resistance of the gate line is reduced, and at the same time, the resistance of the source line is reduced.

After that, an interlayer insulating film is formed by LP-CVD or P-CVD, for example, and then, a bit line contact is formed on the bit line side of the select transistors. Then, upper layer wiring is formed to complete the NAND nonvolatile semiconductor memory.

As described above, according to this embodiment, the connection layers for connecting the floating gate and the control gate to each other in the regions in which the select transistors are to be formed and the source line (wiring layer) between the select transistors are simultaneously formed. Thus, no additional lithography step is required, and the manufacturing cost is reduced.

In addition, since the surface of the source line is silicided simultaneously with the surface of the gate line, the resistance of the source line can be easily reduced.

In addition, the resist pattern for forming the first contact hole for forming the connection layer and the resist pattern for forming the second contact hole for forming the source line are both narrow space patterns extending in the direction of the gate line. Thus, a margin for lithography can be easily ensured.

In this embodiment described above, cobalt silicide is formed by a salicide process. However, titanium, nickel or the like can also be used for the salicide process.

As described above, according to the method of manufacturing a nonvolatile semiconductor memory according to this embodiment, the required wiring layers can be formed at a reduced manufacturing cost.

As described above, in this embodiment, after the silicon nitride film 12 is formed, and the silicon oxide film 13 is formed on the silicon nitride film 12, the resist pattern 14 is formed, and the first and second contact holes (openings) 15 and 16 are formed using the resist pattern 14. However, the same effects and advantages can be achieved if, as required, the silicon nitride film 12 is omitted, or another insulating film is interposed between the silicon oxide film 13 and the resist pattern 14.

Second Embodiment

In the first embodiment described above, the first contact hole for forming the connection layer and the second contact hole for forming the wiring layer are simultaneously patterned.

In a second embodiment described below, the first contact hole and the second contact hole are separately patterned.

A method of manufacturing a nonvolatile semiconductor memory according to the second embodiment includes the same steps as those described in the first embodiment and shown in FIGS. 2 to 5. Furthermore, the configuration of the nonvolatile semiconductor memory according to the second embodiment is the same as the configuration of the nonvolatile semiconductor memory 100 shown in FIG. 1.

Figure 11:
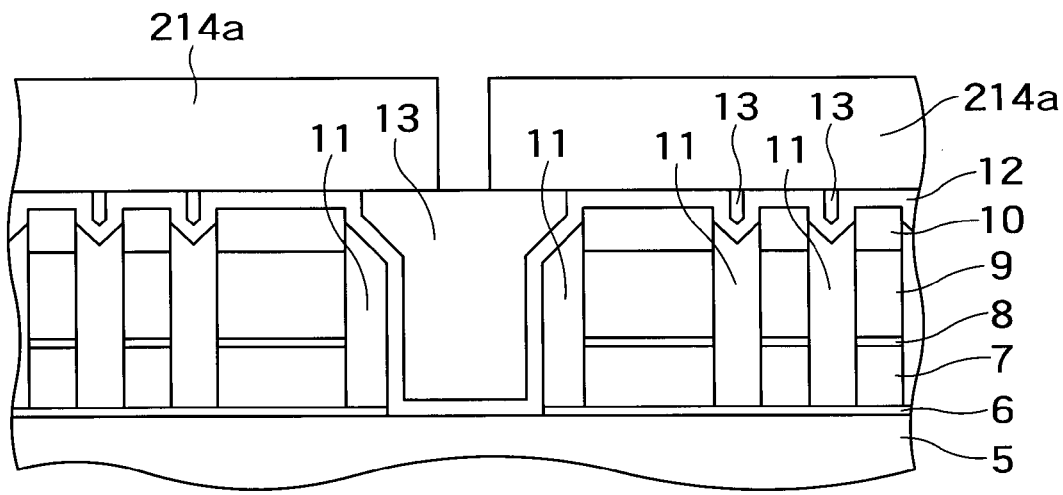
FIG. 11 is a cross-sectional view taken along the line A-A in FIG. 1 showing step of a method of manufacturing a nonvolatile semiconductor memory according to a second embodiment.
Figure 12:
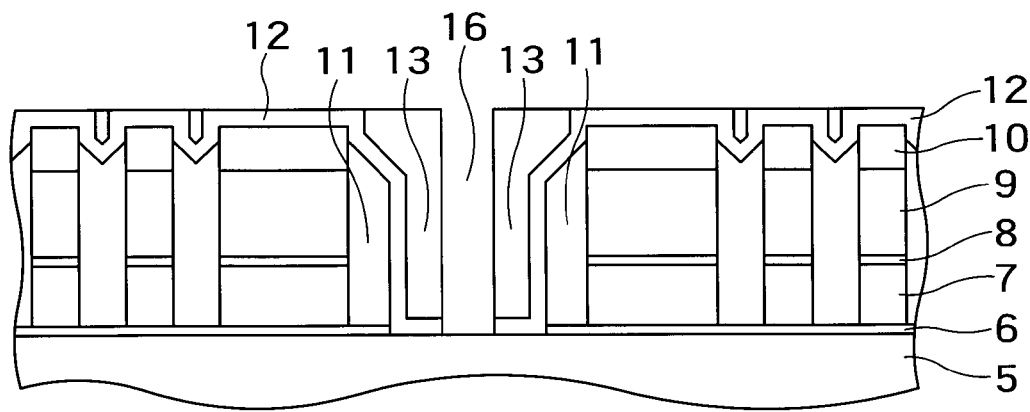
FIG. 12 is a cross-sectional view taken along the line A-A in FIG. 1 showing step of the method of manufacturing a nonvolatile semiconductor memory according to the second embodiment.
Figure 13:
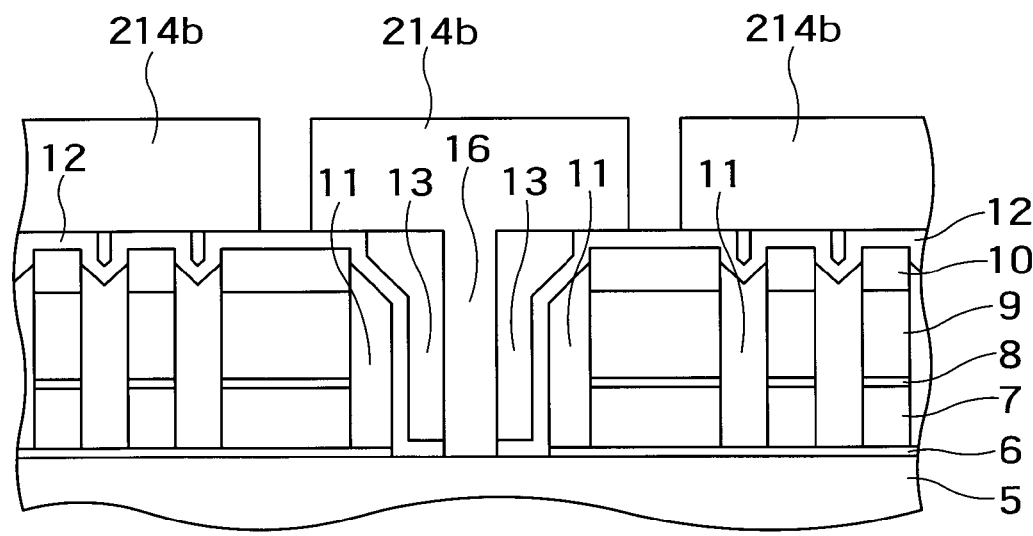
FIG. 13 is a cross-sectional view taken along the line A-A in FIG. 1 showing step of the method of manufacturing a nonvolatile semiconductor memory according to the second embodiment.

FIGS. 11 to 13 are cross-sectional views taken along the line A-A in FIG. 1 showing steps of the method of manufacturing a nonvolatile semiconductor memory according to the second embodiment, which is an aspect of the present invention. In the drawings, the same reference numerals as those in the first embodiment denote the same parts as those in the first embodiment.

Following the step shown in FIG. 5, a resist pattern 214a for forming the second contact hole is formed by lithography (FIG. 11).

Then, on the source side in the region in which the select transistor 4 is to be formed, the silicon oxide film 13 and the silicon nitride film 12 are etched by dry etching to form the second contact hole 16, thereby exposing the surface of the semiconductor substrate 5 (FIG. 12). As in the first embodiment, the second contact hole 16 is intended to allow formation of the wiring layer in the silicon oxide film (embedded insulating film) 13 between the adjacent select transistors. Thus, the contact hole 16 is formed to allow the wiring layer 18 electrically connected to the semiconductor substrate 5 to be formed on the semiconductor substrate 5.

Following the dry etching, the resist pattern 214a is subjected to ashing and removed with a chemical solution.

Then, a resist pattern 214b for forming the first contact hole is formed by lithography (FIG. 13).

Then, in the region in which the select transistor 4 is to be formed, the silicon nitride films 10 and 12, the second conductive film 9 and the second gate insulating film (ONO film) 8 are etched by dry etching to form the first contact hole 15. As in the first embodiment, the first contact hole 15 is intended to allow formation of the connection layer that electrically connects the second conductive film 9 in the region in which the select transistor 4 is to be formed to the first conductive film 7 in the region in which the select transistor 4 is to be formed.

Following the dry etching, the resist pattern 214b is subjected to ashing and removed with a chemical solution. Thus, the same structure as shown in the cross-sectional view of FIG. 7 in the first embodiment is provided.

In this way, the opening in the insulating film and control gate on the floating gate of each select transistor 4 and the opening between the select transistors are formed using different resist patterns.

Then, as in the first embodiment, a third conductive film (phosphorus doped polysilicon film, for example) is formed by LP-CVD in the first contact hole 15 and the second contact hole 16 and then etched back by dry etching. In this way, the third conductive film is embedded simultaneously in the first contact hole 15 and the second contact hole 16, thereby forming a connection layer 17 and a wiring layer 18 (FIG. 8).

After that, as in the first embodiment, the steps shown in FIGS. 9 and 10 are performed. Then, an interlayer insulating film is formed by LP-CVD or P-CVD, for example, and then, a bit line contact is formed on the bit line side of the select transistors. Then, upper layer wiring is formed to complete the NAND nonvolatile semiconductor memory.

As described above, in this embodiment, the connection layer and the wiring layer are formed in two separate lithography steps. However, since at least the third conductive film is embedded simultaneously in the first and second contact holes to form the connection layer and the wiring layer, the number of manufacturing steps and the manufacturing cost are reduced compared with the conventional technique described earlier.

In the second embodiment, the first contact hole 15 and the connection layer 17 are formed after the second contact hole 16 and the wiring layer 18 are formed. However, the second contact hole 16 and the wiring layer 18 may be formed after the first contact hole 15 and the connection layer 17 are formed.

Furthermore, as in the first embodiment, the connection layer 17 can be used not only for the select transistors 4 but also for another transistor (not shown) near the select transistors 4.

Furthermore, as in the first embodiment, the wiring layer 18 can also be used as a line other than the source line. In this case, the second contact hole 16 in which the wiring layer 18 is formed may not penetrate to the semiconductor substrate 5.

As described above, according to the method of manufacturing a nonvolatile semiconductor memory according to this embodiment, the required wiring layers can be formed at a reduced manufacturing cost.

As described above, in this embodiment, after the silicon nitride film 12 is formed, and the silicon oxide film 13 is formed on the silicon nitride film 12, the first and second resist patterns 214a and 214b are formed, and the first and second contact holes (openings) 15 and 16 are formed using the resist patterns 214a and 214b.

However, the same effects and advantages can be achieved if, as required, the silicon nitride film 12 is omitted, or another insulating film is interposed between the silicon oxide film 13 and the first or second resist pattern 214a or 214b.

What is claimed is:

1. A method of manufacturing a NAND nonvolatile semiconductor memory which involves forming a bit line contact between adjacent select transistors of the NAND nonvolatile semiconductor memory, the method comprising:

patterning memory cells and said select transistors of said NAND nonvolatile semiconductor memory;

forming a first insulating film between adjacent two of said memory cells, between said memory cells and said select transistors, and between adjacent two of said select transistors;

selectively etching the first insulating film between said select transistors to form a side wall spacer on each of said select transistors;

forming a second insulating film on said memory cells, said first insulating film between said memory cells, said select transistors and said side wall spacers;

forming a resist pattern on said second insulating film;

simultaneously forming a first opening in an insulating film and a control gate on a floating gate of each of said select transistors using said resist pattern and a second opening between said adjacent select transistors using said resist pattern; and simultaneously embedding a conductive film in said first and second openings to form a connection layer that electrically connects the floating gate and the control gate of each of said select transistors to each other and to form said bit line contact between said adjacent select transistors.

2. A method of manufacturing a NAND nonvolatile semiconductor memory which involves forming a bit line contact between adjacent select transistors of the NAND nonvolatile semiconductor memory, the method comprising:

patterning memory cells and said select transistors of said NAND nonvolatile semiconductor memory;

forming a first insulating film between adjacent two of said memory cells, between said memory cells and said select transistors, and between adjacent two of said select transistors;

selectively etching the first insulating film between said select transistors to form a side wall spacer on each of said select transistors;

forming a second insulating film on said memory cells, said first insulating film between said memory cells, said select transistors and said side wall spacers;

forming a first resist pattern on said second insulating film;

forming a first opening in an insulating film and a control gate on a floating gate of each of said select transistors using said first resist pattern;

forming a second resist pattern on said second insulating film;

forming a second opening between said adjacent select transistors using said second resist pattern; and simultaneously embedding a conductive film in said first and second openings to form a connection layer that electrically connects the floating gate and the control gate of each of said select transistors to each other and to form said bit line contact between said adjacent select transistors.

3. The method of manufacturing a NAND nonvolatile semiconductor memory according to claim 1, further comprising:

siliciding the surface of the control gates of said memory cells, the surface of the control gates of said select transistors and the surface of said bit line contact by a salicide process.

4. The method of manufacturing a NAND nonvolatile semiconductor memory according to claim 2, further comprising:

siliciding the surface of the control gates of said memory cells, the surface of the control gates of said select transistors and the surface of said bit line contact by a salicide process.

5. The method of manufacturing a NAND nonvolatile semiconductor memory according to claim 1, wherein said bit line contact is a source line connected to said select transistors.

6. The method of manufacturing a NAND nonvolatile semiconductor memory according to claim 1, wherein said bit line contact is a source line connected to said select transistors.

7. The method of manufacturing a NAND nonvolatile semiconductor memory according to claim 2, wherein said bit line contact is a source line connected to said select transistors.

8. The method of manufacturing a NAND nonvolatile semiconductor memory according to claim 3, wherein said bit line contact is a source line connected to said select transistors.

9. The method of manufacturing a NAND nonvolatile semiconductor memory according to claim 4, wherein said bit line contact is a source line connected to said select transistors.

10. The method of manufacturing a NAND nonvolatile semiconductor memory according to claim 1, wherein said first opening terminates on the floating gate of each of said select transistors.

11. The method of manufacturing a NAND nonvolatile semiconductor memory according to claim 2, wherein said first opening terminates on the floating gate of each of said select transistors.

\* \* \* \* \*